United States Patent [19]

Yoshikawa et al.

[11] Patent Number: 5,902,129
[45] Date of Patent: May 11, 1999

[54] PROCESS FOR FORMING IMPROVED COBALT SILICIDE LAYER ON INTEGRATED CIRCUIT STRUCTURE USING TWO CAPPING LAYERS

[75] Inventors: Stephanie A. Yoshikawa, Palo Alto; Zhihai Wang, Sunnyvale; Wilbur G. Catabay, Santa Clara, all of Calif.

[73] Assignee: LSI Logic Corporation, Milpitas, Calif.

[21] Appl. No.: 08/833,597

[22] Filed: Apr. 7, 1997

[51] Int. Cl.[6] .................. H01L 21/3205; H01L 21/4763
[52] U.S. Cl. .......................... 438/592; 438/682; 438/976
[58] Field of Search .................................. 438/592, 682, 438/976

[56] References Cited

U.S. PATENT DOCUMENTS

| | | |
|---|---|---|
| 4,378,628 | 4/1983 | Levinstein et al. . |
| 4,920,073 | 4/1990 | Wei et al. . |
| 5,043,300 | 8/1991 | Nulman .................................... 437/200 |
| 5,236,868 | 8/1993 | Nulman .................................... 437/190 |
| 5,567,651 | 10/1996 | Berti et al. . |
| 5,593,924 | 1/1997 | Apte et al. . |
| 5,627,102 | 5/1997 | Shinriki et al. . |
| 5,710,438 | 1/1998 | Oda et al. .................................. 257/69 |
| 5,770,515 | 6/1998 | Meng et al. ............................. 438/592 |
| 5,780,349 | 7/1998 | Naem ...................................... 438/305 |

OTHER PUBLICATIONS

Berti, Antonio C., et al., "A Manufacturable Process for the Formation of Self Aligned Cobalt Silicide in a Sub Micrometer CMOS Technology", *1992 Proceedings Ninth International VLSI Multilevel Interconnection Conference (VMIC)*, Jun. 9–10, 1992, Santa Clara, CA, pp. 267–273.

Wang, Q.F., et al., "New $CoSi_2$ Salicide Technology for 0.1 $\mu m$ Processes and Below", *1995 Symposium on VLSI Technology Digest of Technical Papers*, pp. 17–18.

Yamazaki, Tatsuya, et al., "21 psec Switching 0.1 $\mu m$–CMOS at Room Temperature Using High Performance Co Salicide Process", *IEDM 93*, pp. 6.7.1.–6.7.3, 1993.

*Primary Examiner*—Richard A. Booth
*Attorney, Agent, or Firm*—John P. Taylor

[57] ABSTRACT

The formation of a cobalt silicide layer of uniform thickness over the source/drain regions and the polysilicon gate electrode of an MOS structure, which does not thin out adjacent the edges of the top surface of the polysilicon gate electrode, i.e., adjacent the oxide spacers, is achieved by first forming a titanium capping layer over a cobalt layer deposited over the MOS structure prior to formation of the cobalt silicide, and while excluding oxygen-bearing gases from the cobalt surface prior to the deposition of the titanium capping layer. Oxygen-bearing gases are then excluded from contact with the titanium capping layer prior to at least the initial annealing step to form cobalt silicide, by forming a protective titanium nitride layer over the titanium layer, either: (1) in the same chamber used to deposit the titanium layer, or (2) while still maintaining the titanium-coated semiconductor substrate in an oxygen-free atmosphere during transfer of the titanium-coated semiconductor substrate from the titanium deposition chamber to a separate titanium nitride deposition chamber. In either event, the titanium capping layer is deposited over the cobalt layer, and the protective titanium nitride layer is then formed over the titanium capping layer, prior to the first annealing step, to thereby protect the cobalt layer from oxygen-bearing gases, resulting in the formation of cobalt silicide of substantially uniform thickness over the top surface of the polysilicon gate electrode.

20 Claims, 3 Drawing Sheets

PROCESS FOR FORMING IMPROVED COBALT SILICIDE LAYER ON INTEGRATED CIRCUIT STRUCTURE USING TWO CAPPING LAYERS

BACKGROUND OF THE INVENTION

1. Field of the Invention

This invention relates to the formation of integrated circuit structures on semiconductor substrates. More particularly, this invention relates to a process for forming a cobalt silicide ($CoSi_2$) conductive layer on an integrated circuit structure.

2. Description of the Related Art

In the formation of integrated circuit structures, and particularly in the formation of MOS devices using polysilicon gate electrodes, it has become the practice to provide a metal silicide layer over the polysilicon gate electrode, and over the source/drain regions of the silicon substrate, to facilitate electrically and metallurgically connecting the silicon to metal interconnects. Thus, for example, a titanium metal layer is usually blanket deposited over the polysilicon gate electrode and the source/drain regions of the silicon substrate, as well as over the silicon oxide insulation regions of the substrate, e.g., the field oxide regions. The structure is then heated sufficiently to cause the titanium in contact with the silicon to react, thereby forming titanium silicide, e.g., heated to about 700° C., while the titanium over the silicon oxide does not react. The unreacted titanium is then removed, leaving only titanium silicide over the silicon source/drain regions of the substrate and over the polysilicon gate electrode. The resulting titanium silicide is then further annealed at a higher temperature, e.g., higher than about 750° C., to cause the earlier formed titanium silicide, formed as a high resistivity C49 phase, to convert to the more electrically desirable (lower resistivity) C54 phase (the structure is not initially annealed at the higher (C54-forming) temperature because the titanium tends to also react with the silicon oxide insulation at the higher temperature). A metal layer, such as tungsten, aluminum, etc. can then be deposited over the titanium silicide layer.

However, as the sizes of integrated circuit structures have continued to become smaller and smaller, problems have arisen with the continued use of titanium silicide, particularly in the formation of narrow lines, because the higher resistivity C49 phase of titanium silicide tends to predominate on narrower lines. This is apparently due to the failure of the C49 phase to convert to the low resistivity C54 phase when the line width approaches the grain size of the C49 phase. It has, however, been found that cobalt silicide ($CoSi_2$) is not subject to the same phase problems when used in forming narrow lines. However, cobalt does not reduce oxide as well as titanium, and thus the cleanliness of the semiconductor substrate is much more critical if cobalt is used to form the desired metal silicide. Furthermore, the variation in oxidation rates of differently doped silicon substrates can also cause cobalt silicide formation to be substrate dependent.

Berti et al., in an article entitled "A MANUFACTURABLE PROCESS FOR THE FORMATION OF SELF ALIGNED COBALT SILICIDE IN A SUB MICROMETER CMOS TECHNOLOGY", published on pages 267–273 of the VMIC Conference held in Santa Clara, Calif. in 1992, state that processing temperature, resistivity, contact resistance, junction leakage, and stress are all lower when using cobalt silicide instead of titanium silicide. However, they report that the difficulty in implementing cobalt silicide in a manufacturing environment has been due to the inability to repeatedly avoid unwanted cobalt silicide overgrowth on the oxide spacers (which can result in electrical shorting) while simultaneously forming thick and uniform cobalt silicide. They reported that the problem of cobalt silicide overgrowth on the oxide portions of the integrated circuit structure could be eliminated by the reactive sputtering of a capping layer of titanium nitride over the layer of cobalt prior to the annealing step to form cobalt silicide.

A later article by Yamazaki et al., entitled "21 psec switching 0.1 $\mu$m-CMOS at room temperature using high performance Co salicide process", published on pages 6.7.1–6.7.3 of 906 IDEM 93, reports that in conventional cobalt salicide (self-aligned silicide), the gate sheet resistance increased below a 1.0 $\mu$m gate length because the cobalt layer was oxidized during the first silicidation annealing. They reported that the use of a titanium nitride capping layer over the cobalt salicide effectively avoided the oxidation and drastically improved the gate length dependence of the gate sheet resistance, resulting in the achievement of a gate delay of 21 ps for a 0.1 $\mu$m gate length and 19 ps for a 0.075 $\mu$m gate length.

It has also been proposed to provide a capping layer of titanium over the cobalt layer prior to the silicidation step. Wang et al., in an article entitled "New $CoSi_2$ SALICIDE Technology for 0.1 $\mu$m Processes and Below", published on pages 17 and 18 of the 1995 Symposium on VLSI Technology Digest of Technical Papers, report that the use of titanium over cobalt in the formation of cobalt silicide provides a much smoother $CoSi_2$/poly interface than the conventional process with less sensitivity to pre-sputtering surface conditions and annealing conditions. They also indicate, however, that it is difficult to form thin $CoSi_2$ on a sub-0.1 $\mu$m poly-Si runner using the conventional process, but that the use of a thin titanium capping layer improves both the formation and thermal stability of sub-0.1 $\mu$m $CoSi_2$/Poly stacks.

While the foregoing articles indicate superior results in the use of cobalt silicide ($CoSi_2$) for 0.1 $\mu$m line technology when the cobalt layer is capped with either titanium or titanium nitride, it has been found that there still exists problems with the use of even capped cobalt silicide, at least with respect to the uniformity of the thickness of cobalt silicide ($CoSi_2$) formed over the polysilicon gate electrode. An example of this is illustrated in prior art FIG. 1. FIG. 1 shows a portion of an integrated circuit structure comprising a silicon substrate 2 having a conventional NMOS structure formed thereon, it being understood that the problem is not limited to the construction of NMOS devices, but is also applicable to PMOS devices. In the illustrated MOS structure, N+ source/drain regions 4 and 6 are formed in P type silicon substrate 2 adjacent field oxide portions 8, with a gate oxide layer 10 and a polysilicon gate electrode 12 formed over silicon substrate 2 in between source/drain regions 4 and 6, and with oxide spacers 13 formed on the sidewalls of polysilicon gate electrode 12. FIG. 1 further shows cobalt silicide ($CoSi_2$) segments 14 and 16 formed respectively over source/drain regions 4 and 6 and cobalt silicide segment 18 formed over the top surface of polysilicon gate electrode 12. In this conventional prior art formation of cobalt silicide, wherein the substrate and/or the cobalt layer is not sufficiently protected from exposure to oxygen prior to the annealing step, the silicide formation will be degraded. For example, it will be noted in prior art FIG. 1 that the end portions 19 of cobalt silicide segment 18 on the top surface of polysilicon gate electrode 12 adjacent oxide spacers 13 are thinner than the remainder of cobalt silicide segment 18.

SUMMARY OF THE INVENTION

In accordance with the invention, it has been discovered that the successful application of cobalt silicide in MOS structure, particularly in the formation of cobalt silicide (CoSi$_2$) in 0.1 µm technology, is very oxygen-sensitive and even the exclusion of external oxygen from the cobalt metal after deposit thereof over the silicon by the use of a titanium nitride capping layer, as disclosed by the above-discussed Yamazaki et al. article, does not seem to be sufficient to cure this problem. More particularly, it has been found that the presence of oxygen in the cobalt layer, from oxide regrowth between the preclean and deposition, and during the cobalt deposition process, and prior to any capping of the cobalt layer, can result in the formation of a cobalt silicide layer over the polysilicon gate electrode which is not uniform in thickness, but rather unexpectedly thins out adjacent the edges of the top surface of the polysilicon gate electrode, i.e., adjacent to the oxide spacers.

In accordance with the invention, a titanium capping layer is formed over the cobalt layer formed on the MOS structure, prior to formation of the cobalt silicide, and while totally excluding oxygen-bearing gases from the cobalt surface prior to the deposition of the titanium capping layer; and then, while continuing to exclude oxygen-bearing gases from contact with the titanium capping layer, a second capping layer of titanium nitride is formed over the titanium capping layer. The second capping layer of titanium nitride is formed over the titanium capping layer either: (1) in the same chamber used to deposit the titanium layer, or (2) in a separate titanium nitride deposition chamber, while still maintaining the titanium-coated semiconductor substrate in an oxygen-free atmosphere during transfer of the titanium-coated semiconductor substrate from the titanium deposition chamber to the separate titanium nitride deposition chamber. In either event, the titanium capping layer is deposited over the cobalt layer, and the second capping layer of titanium nitride is formed over the titanium capping layer, prior to the first annealing step.

DETAILED DESCRIPTION OF THE INVENTION

Figure 1:
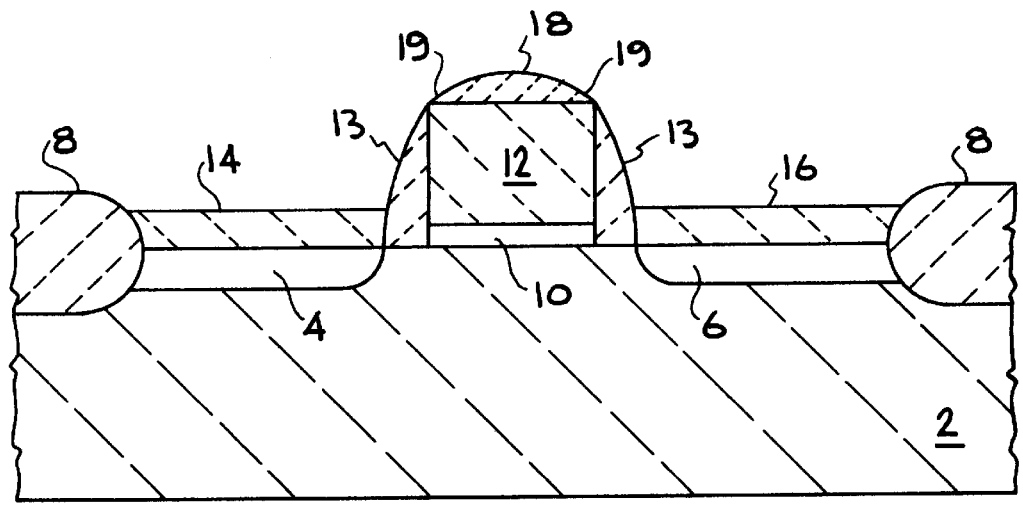
FIG. 1 is a fragmentary vertical cross-sectional view of a portion of an MOS device including a polysilicon gate electrode having a cobalt silicide layer formed over the top surface of the polysilicon gate electrode in accordance with the prior art, illustrating the thinning of the cobalt silicide layer at the edges of the top of the gate electrode.
Figure 2:
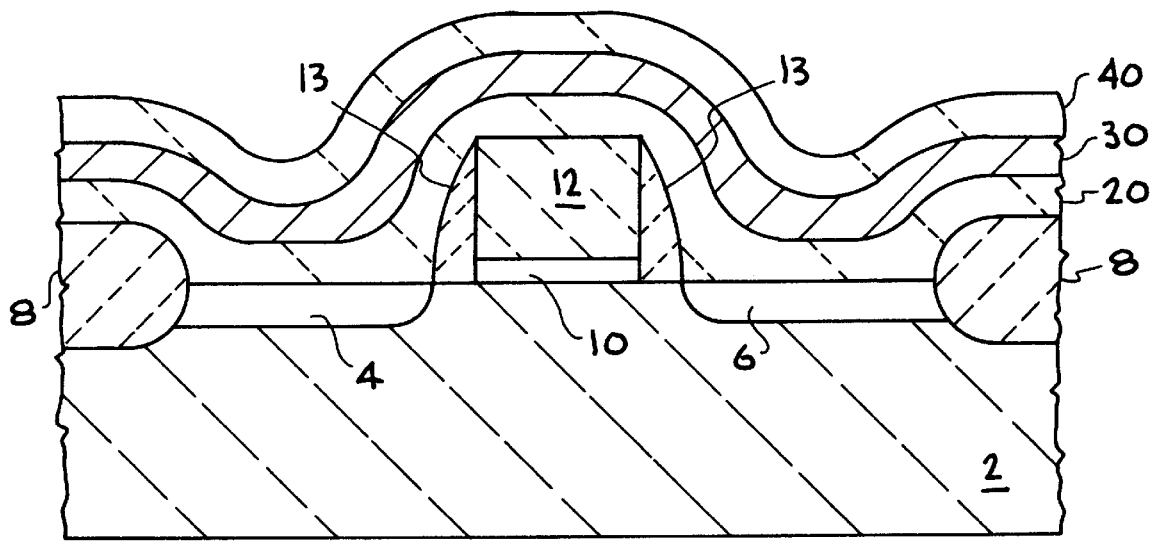
FIG. 2 is a fragmentary vertical cross-sectional view of a portion of an MOS device which includes a polysilicon gate electrode having a cobalt layer formed over the polysilicon gate electrode, a first titanium capping layer formed over the cobalt layer, and a second capping layer of titanium nitride formed over the titanium capping layer, in accordance with the invention, prior to the first annealing step to form cobalt silicide.

Turning now to FIG. 2, the same basic NMOS device is shown as in FIG. 1, but prior to the formation of cobalt silicide over source/drain regions 4 and 6 or over polysilicon gate electrode 12. In FIG. 2, after precleaning of the silicon substrate, e.g., an HF preclean, a layer of cobalt 20 is first deposited over the MOS device (regardless of whether the MOS device is an NMOS device, as illustrated or a PMOS device), and in particular over the exposed upper surfaces of polysilicon gate electrode 12 and silicon source/drain regions 4 and 6 of the MOS device. Titanium layer 30 is then deposited over cobalt layer 20, and titanium nitride layer 40 is then deposited over titanium layer 30.

Cobalt layer 20 is deposited over the MOS structure, and in particular over the exposed silicon surfaces of source/drain regions 4 and 6 and the exposed top surface of polysilicon gate electrode 12, to a thickness of at least about 30 Å, and preferably at least about 100 Å, to provide a sufficient amount of cobalt for the subsequent reaction with the underlying silicon to provide a satisfactory thickness of the desired cobalt silicide. The thickness of the deposited cobalt layer may be up to as much as about 400 Å, with higher amounts being usable, but not deemed necessary. Preferably, the thickness of the cobalt layer will vary from about 125 Å to about 275 Å, with a typical thickness being about 180 Å. Cobalt layer 20 is conventionally deposited over the MOS structure on silicon substrate 2 in a vacuum chamber, such as a w sputtering chamber, after appropriate cleaning of the substrate to remove any oxygen-bearing residues. The pressure used during the deposition of cobalt layer 20 may vary from about 0.1 milliTorr to about 1 Torr, while the temperature may range from about 20° C. to about 300° C.

Thereafter, and without exposing the newly deposited cobalt layer to any oxygen-bearing gases, a capping layer of titanium 30 is formed over cobalt layer 20. Preferably, titanium layer 30 is formed over cobalt layer 20 by sputtering in the same sputtering chamber, or at least in another chamber in the same vacuum apparatus, using a different sputtering target. Titanium capping layer 30 is formed to a thickness of at least about 10 Å, preferably at least about 50 Å, and up to a thickness of about 200 Å. Although thicker layers of titanium may be used, such is not deemed necessary and thus is deemed to be undesirable from a standpoint of using valuable process time in the deposition apparatus. The pressure used during the deposition of titanium layer 30 may vary from about 0.1 milliTorr to about 1 Torr, while the temperature may range from about 20° C. to about 300° C.

Although we do not wish to be bound by any theories of operation, it is believed that titanium layer 30 functions not only as a shield or cap to protect cobalt layer from exposure to oxygen-bearing gases prior to the annealing step, but also as a gettering agent to extract and remove from the cobalt, or at the cobalt-silicon interface, contaminants including any oxygen-bearing gases occluded or adsorbed within cobalt layer 20, for example, during the sputtering step to form cobalt layer 20, if the cobalt sputtering target contains any such adsorbed or occluded gases. In any event, it has been found that titanium capping layer 30 is, in turn, also very sensitive to the presence of oxygen-bearing gases which, if present, appear to be capable of interfering with the positive benefits of forming titanium layer 30 directly over cobalt layer 20. Therefore, it is very important that titanium layer 30 also be protected against exposure to oxygen-bearing gases prior to the initial step of annealing the cobalt to form the first cobalt silicide phase (the CoSi phase).

In accordance with the invention, as illustrated in FIG. 2, titanium layer 30 is protected from oxygen-bearing gases prior to the annealing step to form cobalt silicide by forming a second capping layer of titanium nitride 40 over titanium capping layer 30, while excluding oxygen-bearing gases from contact with titanium layer 30. Titanium nitride capping layer 40, while not functioning as a getter layer, acts as a diffusion barrier layer to prevent oxygen-bearing gases from reaching the surface of underlying titanium layer 30.

Titanium nitride layer 40 is preferably formed in the same sputtering chamber used to form titanium layer 30, either by sputtering a titanium nitride target or by reactive sputtering of the titanium target in the presence of a gaseous source of nitrogen. When a separate sputtering chamber is used to form titanium nitride layer 40, the separate sputtering chamber is preferably in the same vacuum apparatus. The thickness of titanium nitride layer 40 may range from about 10 Å to about 250 Å, and preferably will range from about 50 Å to about 150 Å, with a typical thickness comprising about 100 Å. Thicker layers of titanium nitride may be deposited, but are deemed to be unnecessary. The pressure used during the deposition of titanium nitride layer 40 may vary from about 0.1 milliTorr to about 1 Torr, while the temperature may range from about 20° C. to about 300° C.

Figure 3:
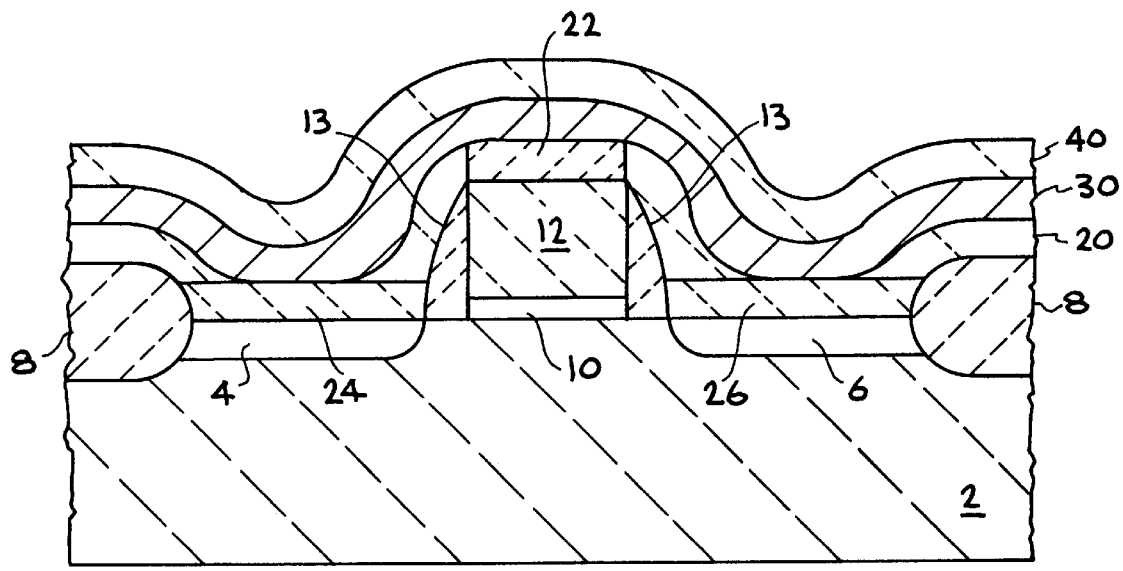
FIG. 3 is a fragmentary vertical cross-sectional view of the structure of FIG. 2 after the structure has been initially annealed to form the cobalt silicide layer over the top surface of the polysilicon gate electrode, but prior to the removal of the capping layers and the unreacted cobalt.

Turning now to FIG. 3, the MOS structure is then initially annealed after the formation of cobalt layer 20, titanium capping layer 30 thereon, and titanium nitride capping layer 40 over titanium layer 30, in accordance with the invention. This first annealing step is preferably carried out using a rapid thermal anneal (RTA) at a temperature ranging from about 350° C. to about 600° C., and most preferably at an annealing temperature of from about 425° C. to about 475° C. for a period of time ranging from about 10 seconds to about 2 minutes, and preferably for a period of from about 10–60 seconds in an annealing chamber in the absence of any oxygen-bearing gases. It should be further noted in this regard that the deposited structure (the substrate having the cobalt, titanium, and titanium nitride layers deposited thereon) should be transferred from the sputtering chamber to the annealing chamber with minimum exposure of the substrate to any oxygen-bearing gases during the transit, i.e., e.g., a minimum "sit" time between the titanium nitride deposition step and the first annealing step. Preferably, the transfer would be accomplished without any exposure of the deposited structure to any oxygen-bearing gases. If possible, it would, in fact, be most preferable if the deposited structure could be annealed in the same chamber used to sputter the cobalt, titanium, and titanium nitride layers on the substrate, or at least annealed in a separate annealing chamber in the same vacuum apparatus in which the sputtering steps take place.

As shown in FIG. 3, during the anneal the portion of cobalt layer 20 directly in contact with silicon substrate source/drain regions 4 and 6 and polysilicon gate electrode 12 reacts with the silicon to form cobalt silicide portions 22 over gate electrode 12 and cobalt silicide portions 24 and 26 respectively above source/drain regions 4 and 6 of silicon substrate 2.

After the initial annealing step to form cobalt silicide portions 22, 24, and 26, all titanium-containing materials and/or compounds derived from capping layers 30 and 40 (including unreacted titanium metal) and all other cobalt-containing materials (including unreacted cobalt and, for example, cobalt oxynitride) may be removed using, for example, appropriate wet etchants for the respective materials, leaving only cobalt silicide portions 22, 24, and 26. Examples of a wet etchant system which may be used to respectively remove the above-discussed materials is a sulfuric acid/hydrogen peroxide etchant system.

After removal of the titanium and titanium-containing materials, compounds, as well as the unreacted cobalt and any non-cobalt silicide reaction products formed such as cobalt oxynitride, the MOS structure is further annealed at a higher temperature of at least about 700° C., and preferably from about 700° C. to about 800° C. This higher temperature anneal, like the prior lower temperature anneal, may be carried out using rapid thermal annealing (RTA) techniques, i.e., for a period of time ranging from about 10 seconds to about 2 minutes, and preferably for a period of from about 10–60 seconds in an annealing chamber. While the capping layers are not required during this anneal, it is desirable to continue to exclude oxygen-bearing gases from the structure during the second anneal step, i.e., the second anneal should be carried out in an atmosphere from which oxygen-bearing gases are excluded.

The reason for using two anneals at two different temperatures, with an intervening removal of the above-discussed materials after the first anneal at the lower temperature, is to permit the selective formation, during the first lower temperature anneal, of cobalt silicide only over the exposed silicon source/drain regions of the substrate and over the exposed polysilicon gate electrode. This, in turn eliminates the need for separate masking and mask removal steps during the initial formation of the cobalt silicide.

However, the initial cobalt silicide formed by the lower temperature first anneal, which may be either CoSi or $CoSi_2$, or a mixture thereof, and which may be referred to as "low temperature cobalt silicide", possesses inferior physical characteristics, including high resistivity. Therefore, this low temperature cobalt silicide needs to be further annealed at the higher temperature of the second anneal, i.e., annealed at a temperature of at least 700° C. to convert the low temperature cobalt silicide formed during the first anneal to a lower resistivity "high temperature cobalt silicide", which consists primarily of $CoSi_2$.

Figure 4:
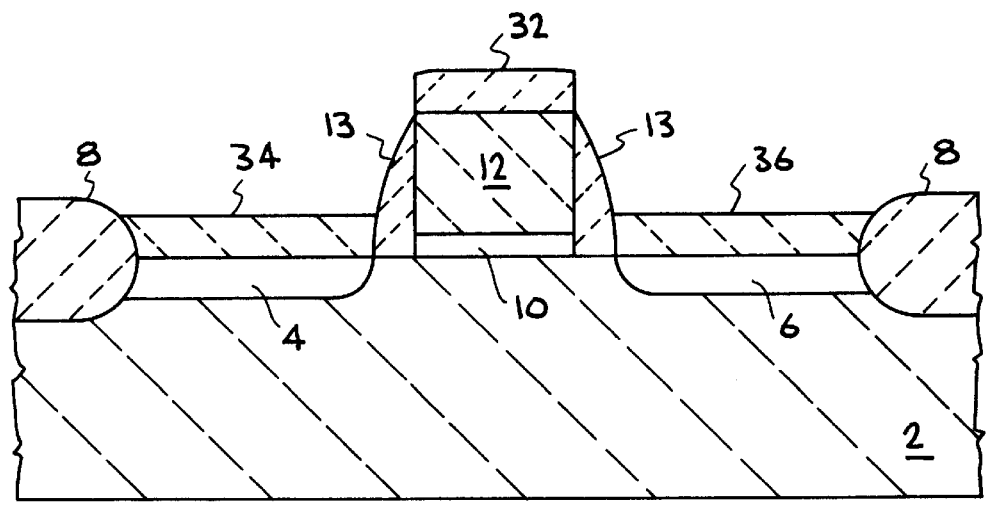
FIG. 4 is a fragmentary vertical cross-sectional view of the structure of FIG. 3 after removal of the capping layers and the unreacted cobalt.
Figure 5:
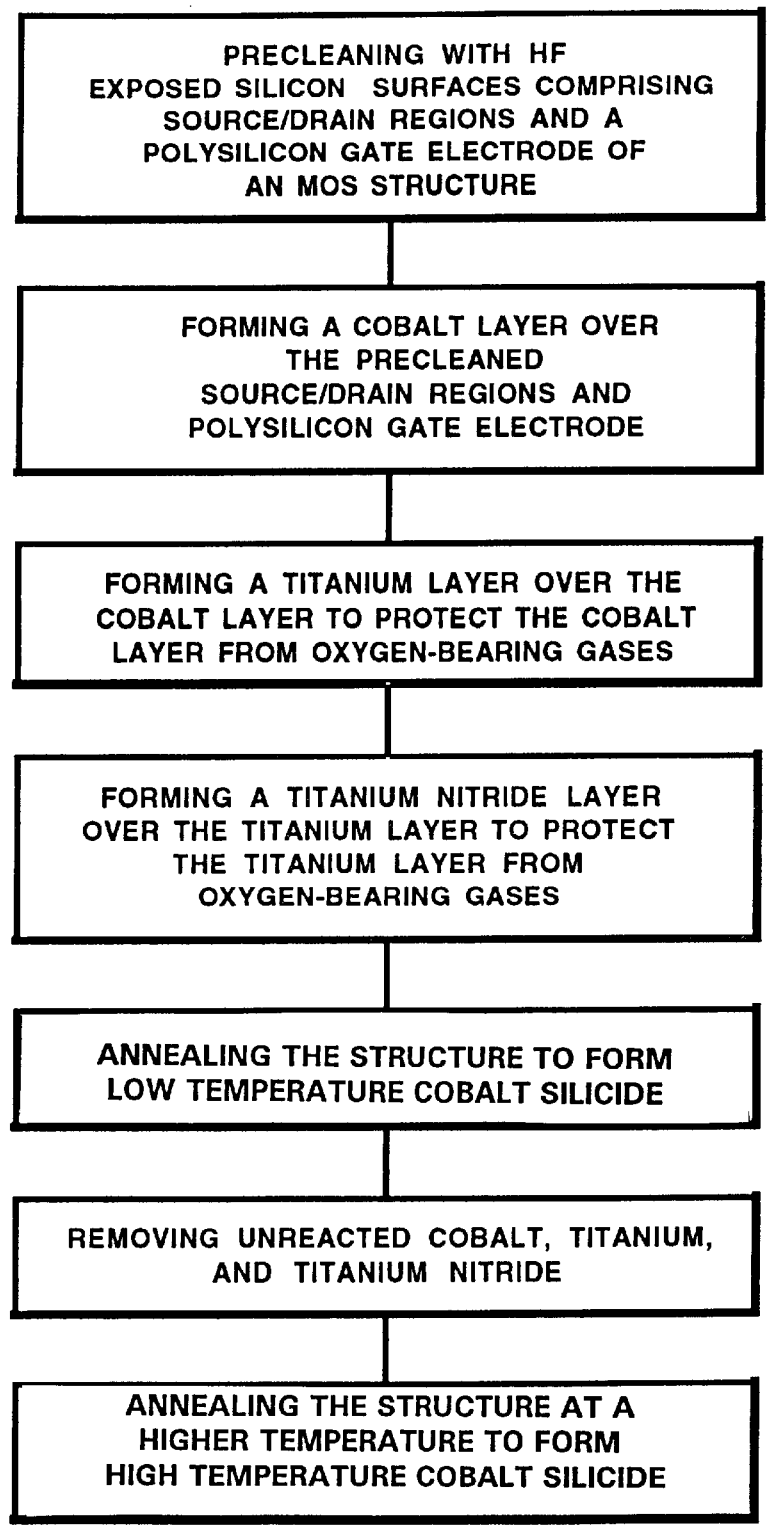
FIG. 5 is a flowsheet illustrating the process of the invention.

The result of the process of the invention, as shown in FIG. 4, is an integrated circuit structure with an MOS device having cobalt silicide ($CoSi_2$) segments 32, 34, and 36 of uniform thickness respectively formed over polysilicon gate electrode 12 and over source/drain regions 4 and 6 in silicon substrate 2.

It should be further noted that the conventional cobalt silicide reaction rate varies somewhat with substrate doping. Using the dual cap process of the invention, the variation in the respective cobalt silicide thickness grown over N and P doped monocrystalline and polycrystalline silicon, is reduced by more than 20% compared to a single cap process.

Thus, the invention provides a process for the satisfactory formation of cobalt silicide ($CoSi_2$) of uniform thickness over silicon surfaces of an integrated circuit structure by first protecting the deposited cobalt layer, prior to the first annealing step, from exposure to oxygen-bearing gases with a first capping layer of titanium which also acts as an oxygen getter. The titanium cap is, in turn, protected itself from exposure to oxygen-bearing gases by formation of a further protective capping layer of titanium nitride over the titanium layer.

Having thus described the invention what is claimed is:

1. A process for forming an MOS structure on a silicon substrate comprising cobalt silicide contacts formed over the source/drain regions of said MOS structure and over a polysilicon gate electrode of said MOS structure which comprises:
   a) forming a cobalt layer over said MOS structure;
   b) forming a titanium layer over said cobalt layer without exposing said cobalt layer to oxygen-bearing gases;
   c) forming a titanium nitride layer over said titanium layer without exposing said titanium layer to oxygen-bearing gases;

d) thereafter annealing said MOS structure at a first temperature to form cobalt silicide over said silicon source/drain regions and said polysilicon gate electrode of said MOS structure.

2. The process of claim 1 including the additional step of removing unreacted cobalt, titanium, and titanium nitride from said MOS structure after said annealing step.

3. The process of claim 2 including the further step of annealing said MOS structure at a second temperature higher than said first temperature after said step of removing said unreacted cobalt, titanium, and titanium nitride, to convert the initial low temperature cobalt silicide formed at said first annealing temperature to high temperature cobalt silicide.

4. The process of claim 3 wherein said first temperature at which said MOS structure is initially annealed comprises a temperature ranging from about 350° C. to about 600° C.

5. The process of claim 3 wherein said second temperature at which said MOS structure is subsequently annealed comprises a temperature ranging of at least about 700° C.

6. A process for forming an MOS structure on a silicon substrate comprising cobalt silicide contacts formed over the source/drain regions of said MOS structure and over a polysilicon gate electrode of said MOS structure and further characterized by a uniform thickness of cobalt silicide formed over said polysilicon gate electrode which comprises:

a) forming a cobalt layer over said MOS structure;

b) forming a titanium layer over said cobalt layer without exposing said cobalt layer to oxygen-bearing gases;

c) forming a titanium nitride layer over said titanium layer without exposing said titanium layer to oxygen-bearing gases;

d) thereafter annealing said MOS structure at a first temperature of from about 350° C. to about 600° C. to form low temperature cobalt silicide over said silicon source/drain regions and said polysilicon gate electrode of said MOS structure without exposing said titanium layer to oxygen-bearing gases;

e) then removing from said MOS structure after said annealing step at said first temperature, unreacted cobalt and all titanium-containing materials and/or compounds including unreacted titanium metal; and f) then annealing said MOS structure at a second temperature of at least about 700° C., after said step of removing said unreacted cobalt and all titanium-containing materials and/or compounds including unreacted titanium metal, to convert the initial low temperature cobalt silicide formed at said first annealing temperature to high temperature cobalt silicide.

7. The process of claim 6 wherein said step of forming said layer of cobalt over said MOS structure further comprises sputtering at least about 30 Å of cobalt over said silicon source/drain regions and polysilicon gate electrode of said MOS structure.

8. The process of claim 6 wherein said step of forming said layer of cobalt over said MOS structure further comprises sputtering at least about 100 Å of cobalt over said silicon source/drain regions and polysilicon gate electrode of said MOS structure.

9. The process of claim 6 wherein said step of forming said layer of titanium over said cobalt layer further comprises sputtering at least about 10 Å of titanium over said cobalt layer.

10. The process of claim 6 wherein said step of forming said layer of titanium over said cobalt layer further comprises sputtering at least about 50 Å of titanium over said cobalt layer.

11. The process of claim 6 wherein said step of forming said layer of titanium nitride over said titanium layer further comprises sputtering at least about 10 Å of titanium nitride over said titanium layer.

12. The process of claim 6 wherein said step of forming said layer of titanium nitride over said titanium layer further comprises sputtering at least about 50 Å of titanium nitride over said titanium layer.

13. The process of claim 6 wherein said step of forming said layer of titanium nitride over said titanium layer further comprises reactive sputtering said titanium nitride over said titanium layer using a titanium sputtering target and a gaseous source of nitrogen.

14. The process of claim 6 wherein said step of annealing said MOS structure at said first annealing temperature further comprises annealing said MOS structure at said first temperature for a period of from 10 seconds to about 120 seconds.

15. The process of claim 6 wherein said step of annealing said MOS structure at said first annealing temperature further comprises annealing said MOS structure at said first temperature for a period of from 10 seconds to about 60 seconds.

16. The process of claim 6 wherein said step of removing unreacted cobalt and all titanium-containing containing materials and/or compounds including unreacted titanium metals further comprises removing all cobalt compounds formed on said substrate during said first anneal except cobalt silicide.

17. The process of claim 6 wherein said step of annealing said MOS structure at said second annealing temperature further comprises annealing said MOS structure at said second temperature for a period of from 10 seconds to about 120 seconds.

18. The process of claim 6 wherein said step of annealing said MOS structure at said second annealing temperature further comprises annealing said MOS structure at said second temperature for a period of from 10 seconds to about 60 seconds.

19. A process for forming an MOS structure on a silicon substrate comprising cobalt silicide contacts formed over the source/drain regions of said MOS structure and over a polysilicon gate electrode of said MOS structure and further characterized by a uniform thickness of cobalt silicide formed over said polysilicon gate electrode which comprises:

a) sputtering a cobalt layer of at least about 30 Å over said MOS structure;

b) sputtering a titanium layer of at least about 10 Å over said cobalt layer without exposing said cobalt layer to oxygen-bearing gases;

c) sputtering a titanium nitride layer of at least about 10 Å over said titanium layer without exposing said titanium layer to oxygen-bearing gases;

d) thereafter annealing said MOS structure for about 10 seconds to about 120 seconds at a first temperature of from about 350° C. to about 600° C. to form low temperature cobalt silicide over said silicon source/drain regions and said polysilicon gate electrode of said MOS structure;

e) then removing from said MOS structure after said annealing step at said first temperature, unreacted cobalt and all titanium-containing materials and/or compounds including unreacted titanium metal;

f) then annealing said MOS structure for about 10 seconds to about 120 seconds, at a second temperature of from about 700° C. to about 800° C., after said step of removing said unreacted cobalt and all titanium-containing materials and/or compounds including unreacted titanium metal, to convert the initial low temperature cobalt silicide formed at said first annealing temperature to high temperature cobalt silicide.

20. The process of claim 19 wherein said step of removing unreacted cobalt and all titanium-containing materials and/or compounds including unreacted titanium metal further comprises removing all cobalt compounds formed on said substrate during said first anneal except cobalt silicide.

* * * * *